United States Patent [19]
Feldmann et al.

[11] Patent Number: 6,135,649
[45] Date of Patent: Oct. 24, 2000

[54] METHOD OF MODELING AND ANALYZING ELECTRONIC NOISE USING PADE APPROXIMATION-BASED MODEL-REDUCTION TECHNIQUES

[75] Inventors: Peter Feldmann, Short Hills; Roland Wilhelm Freund, New Providence, both of N.J.

[73] Assignee: Lucent Technologies Inc., Murray Hill, N.J.

[21] Appl. No.: 09/036,846

[22] Filed: Mar. 9, 1998

[51] Int. Cl.$^7$ .............................. G06F 17/50; G06F 17/10
[52] U.S. Cl. ................................ 395/500.35; 395/500.25; 395/500.23
[58] Field of Search ...................... 395/500.35, 500.25, 395/500.23

[56] References Cited

U.S. PATENT DOCUMENTS 5,537,329   7/1996   Feldmann et al. ............... 395/500.05
5,920,484   7/1999   Nguyen et al. ................. 395/500.35

*Primary Examiner*—Kevin J. Teska
*Assistant Examiner*—Hugh Jones

[57] ABSTRACT

A noise-computation method that determines the noise power cross-spectral density matrix of an electronic circuit or system in the form of a closed form rational expression. More specifically, the method provides a matrix-Padé approximation of the noise power cross-spectral density matrix using a numerically robust and efficient block Lanczos-type method.

54 Claims, 7 Drawing Sheets

METHOD OF MODELING AND ANALYZING ELECTRONIC NOISE USING PADÉ APPROXIMATION-BASED MODEL-REDUCTION TECHNIQUES

BACKGROUND OF THE INVENTION

1. Field of the Invention

The present invention relates to a method of modeling and analyzing electronic noise and, more particularly, to a method of obtaining a frequency-dependent analytical Padé approximation of the noise power spectral density of an electronic circuit or system.

2. Description of the Related Art

Noise is a fundamental phenomenon in electronic circuits, caused by the small fluctuations in currents and voltages that occur within the devices of the electronic circuit. The fluctuations are due mainly to the discontinuous nature of electric charge. Determining the effects of noise on electronic circuits and systems is important, as noise often represents the fundamental practical limit of circuit or system performance.

Noise analysis algorithms for circuits in DC steady-state have long been available in commercial simulation software programs such, for example, as SPICE. Such programs typically calculate noise power at a certain user-designated frequency or range of frequencies and provide the calculated data in tabulated form. Circuit or system designers generally reduce the information contained in the noise spectrum, as calculated by the modeling program, to a single number that represents the noise figure for the circuit or system. Such compact representations offer good insight into the circuit or system performance and are convenient for quick estimation of the effect of noise on the circuit or system. However, computer-aided design (CAD) tools for both the circuit and system levels can take advantage of the more accurate and complete information available in the noise spectrum, which is not present in the compact representation provided by the single noise figure. Furthermore, the complete frequency-dependent noise spectrum information calculated by known programs would require hundreds and possibly thousands of iterations to analytically fully model the noise power spectral density of the circuit or system.

The principal sources of noise in integrated circuits are: thermal noise, which occurs in almost all devices as a result of the thermal agitation of the electrons; shot noise, which is associated with direct current flow mainly in bipolar diodes and transistors and is typically due to the fact that the current through a junction consists of discrete charge carriers randomly crossing a potential barrier; and flicker (or 1/f) noise, which occurs in all active devices, and even in some resistors, and is also associated with direct current flow.

Mathematically, integrated circuit device noise is modeled by stochastic processes. A noise stochastic process is a function of time n(t), the value of which at each time point is a random variable. Stochastic processes are characterized in terms of statistical averages, such as the mean and autocorrelation in the time domain, and the power spectral density in the frequency domain.

For example, the thermal noise of a resistor is modeled by a current source in parallel with the resistor. The value of the current source is a zero-mean stochastic process with a constant spectral density at all frequencies equal to $$S_{th}(\omega) = 4kTG, \quad (1)$$

where k is Boltzman's constant, T is the absolute temperature, and G is the conductance. Such a process (i.e. a zero-mean stochastic process), having a spectral density not dependent on frequency, represents white noise.

Shot noise in a junction is also modeled by a white noise current source in parallel with the junction. The spectral density of shot noise is characterized by $$S_{sh}(\omega) = 2qI_d, \quad (2)$$

where q is the electron charge and $I_d$ is the average current through the junction.

Flicker noise is modeled by a stochastic process with a non-constant spectral density according to the following equation:

$$S_{fl}(\omega) = K_1 \frac{I^a}{(2\pi\omega)^b} \quad (3)$$

where I is the average direct current, $K_f$ is a constant for a particular device and process, a is a constant in the range of 0.5 to 2.0, and b is a constant of about one; hence the name 1/f noise. The circuit equations that include the noise excitation are $$f(x(t)) + \frac{d}{dt}q(x(t)) = b_0 + B. \quad (4)$$

Here, x(t) is the vector of circuit variables, typically currents and voltages, f(x(t)) represents the contribution of the resistive components, q(x(t)) is the contribution of the reactive components, $b_0$ is the constant (DC) excitation, B is the noise-source incidence matrix, and n(t) is a vector stochastic process that describes the noise sources. The vector stochastic process n(t) is specified in terms of its frequency-domain cross-spectral density matrix represented by $S_{xx}(\omega)$. The diagonal elements in $S_{xx}(\omega)$ represent the power spectral density of each noise source, and the off-diagonal elements describe statistical coupling of noise signals. In most cases, the noise sources model mutually independent phenomena, hence the corresponding noise sources will be uncorrelated and all off-diagonal elements in $S_{xx}$ will be zero. In practical cases, therefore, $S_{xx}$ will almost always be a diagonal matrix. The model, however, is sufficiently general to capture correlated noise sources when necessary; in this case, non-zero off-diagonal elements will exist in $S_{xx}$.

Assuming that $x_0$ is the solution of the noiseless DC circuit, constant in time, $$f(x_0) + \frac{d}{dt}q(x_0) = b_0 \quad (5)$$

where $$\frac{d}{dt}q(x_0) = 0.$$

The response of a circuit in the presence of noise will be a perturbation, z(t), of the DC solution, $x_0$, $$f(x_0 + z(t)) + \frac{d}{dt}q(x_0 + z(t)) = b_0 + Bn(t). \quad (6)$$

Assuming that the noise signals are small relative to the other signals present in the electronic circuit, the first-order Taylor expansion of equation (6) for the DC solution is sufficiently accurate to model and analyze the circuit in terms of noise as follows:

$$\left| f(x_0) + \frac{\partial f}{\partial x}\bigg|_{x_0} z(t) + \frac{d}{dt}\left(q(x_0) + \frac{\partial q}{\partial x}\bigg|_{x_0}\right) z(t) \right| = b_0 + Bn(t) \quad (7)$$

Considering equation (5) and the fact that $q(x_0)$ and $\partial f/\partial x|_{x_0}$ are constants in time, the linear, stochastic, differential equation for the noise signals represented by the following equation remains $$Gz(t) + C\frac{d}{dt}z(t) = B, \quad (8)$$

where $G = \frac{\partial f}{\partial x}\bigg|_{x_0}$ and $C = \frac{\partial q}{\partial x}\bigg|_{x_0}$ Thus, the noise-analysis problem reduces to that of the propagation of a stochastic process through a linear system.

The general expression of the noise power spectral density at the output of the linear system, $S_{yy}$, is given by the well known formula $$S_{yy}(\omega) = H(j\omega)S_{xx}(\omega)H^H(j\omega). \quad (9)$$

Note that $S_{yy}(\omega)$ is a scalar function of frequency. For analysis of more than one output, $S_{yy}(\omega)$ is the noise power cross-spectral density matrix, a full square matrix, the dimension of which is the number of outputs. In this case, the diagonal elements of $S_{yy}(\omega)$ represent the power spectral density of the noise at each output and the off-diagonal elements represent the cross-spectral densities of output pairs.

For a single-output system, the many-to-one vector transfer function of the linear system from the noise sources to an output port of interest is $$H(j\omega) = l^T(G+j\omega C)^{-1}B, \quad (10)$$

where l denotes the incidence vector that corresponds to the output port of interest. More generally, and for a multi-output system, with p denoting the number of output ports (i.e. when p is greater than 1), there exists a many-to-many matrix-transfer-function from noise sources to the p outputs, defined by $$H(j\omega) = L^T(G+j\omega C)^{-1}B, \quad (11)$$

where L is the incidence matrix (with p columns) of the output ports. Each column of L is an incidence vector corresponding to one of the ports. From the relationship of equation (9), and using equation (11), the noise power cross-spectral density matrix at the output of the system may be obtained using the following equation $$S_{yy}(\omega) = L^T(G+j\omega C)^{-1}BS_{xx}(\omega)B^T(G+j\omega C)^{-H}L. \quad (12)$$

The noise modeling and analysis method implemented in prior art computer or calculation programs such for example as SPICE, evaluates this expression (i.e. equation (12)) efficiently, for a given value of $\omega$), using the solution of the adjoint system $$S_{yy}(\omega) = x^H_a(j\omega)BS_{xx}(\omega)B^Tx_a(j\omega), \quad (13)$$

where $x_a(j\omega)$ is the solution of the adjoint system $$x_a(j\omega) = (G+j\omega C)^{-H}L$$

Noise modeling and analysis using the above-described prior art methods require that frequency domain equations be solved at each discrete frequency point of interest. Depending on the complexity of the circuit or system, this may require hundreds or thousands of computations—the result of which is a table comprised of noise values for each of the desired frequency points. In addition to the disadvantageous expense of these prior art methods by virtue of the time required to model complex circuits and systems, the results produced are not amenable for hierarchical use.

SUMMARY OF THE INVENTION

The present invention provides a noise modeling and analysis method that calculates a closed form rational expression for the noise power spectral density of an electronic circuit or system over a wide frequency range. Doing so is more efficient than prior art methods for calculating the noise spectral density at many frequency points. Moreover, the closed form expression of the present invention represents a compact model of the noise spectrum for the circuit or system of interest that can be accepted as input noise sources when the inventive method is used for hierarchical modeling and analysis.

This is achieved by modeling and analyzing electronic noise using an algorithm to compute a frequency-dependent analytical Padé approximation of the noise power spectral density of an electronic circuit or system. More specifically, the Padé approximation of the noise power spectral density is determined by employing the numerically robust and efficient Lanczos method.

In practice, a circuit designer may design an amplifier, analyze it, and produce a high-level model of its output noise spectrum using the inventive method. The system designer may then use the model produced by the circuit designer in accordance with the present invention for all of the related or associated system components and thus perform a system-level simulation using the inventive noise-analysis method. Advantageously, no information is lost between the circuit designer and system designer due to a limiting interface between circuit-level and system-level models, as occurs with prior art noise-calculation methods.

DETAILED DESCRIPTION OF THE PRESENTLY PREFERRED EMBODIMENTS

The present invention is directed to a method of modeling and analyzing electronic circuit noise using an algorithm to determine the Padé approximation of the noise power spectral density using the numerically robust and efficient Lanczos method. The inventive method advantageously develops a frequency-dependent analytical approximation of the spectral noise density of an electronic circuit or system more efficiently than prior art methods, and in a manner that permits hierarchical modeling and analysis.

Since the inventive method provides a frequency-dependent noise approximation, introduction of a new variable, $s=j\omega$, will facilitate the following detailed description of the present invention. It should be noted that in order to be physically meaningful as a frequency-dependent variable, the variable s must be purely imaginary. Thus, s is initially assumed to be purely imaginary although, as discussed in more detail hereinbelow, s may also be a general complex variable.

A variety of noise sources such, for example, as white noise, shot noise, and flicker noise, may be collectively represented by a single equation representing a general noise-type transfer function. While Padé via Lanczos (PVL) techniques have heretofore been used to compute a reduced-order model of an electronic circuit, i.e., to compute an analytical approximation of the circuit transfer function, PVL techniques have not heretofore been considered for determining the analytical noise power spectral density of an electronic circuit. The present invention converts the general noise-type transfer function of an electronic circuit or system to a format amenable to application of PVL techniques and advantageously employs PVL techniques to analytically model the noise power spectral density of an electronic circuit.

The inventive noise analysis and modeling method relies on the development of matrix-Padé approximations using the noise power spectral density expression represented by equation (12). Matrix-Padé approximations of a general matrix-valued transfer-function expression of the form $$\tilde{F}(s)=\tilde{L}^T(\tilde{G}+s\tilde{C})^{-1}\tilde{R}, \tag{14}$$

can be calculated efficiently using the known MPVL algorithm, which is the appropriate matrix version of PVL. In (14), $\tilde{R}$ and $\tilde{L}$ are matrices of row dimension $\tilde{N}$, and $\tilde{G}$ and $\tilde{C}$ are $\tilde{N}\times\tilde{N}$ matrices. At first glance, it appears that the noise-type transfer function of equation (12) is very different from the general transfer function expression of equation (14). This is not, however, the case as there are matrices $\tilde{R}$, $\tilde{L}$, $\tilde{G}$, and $\tilde{C}$ that equate (12) and (14) for all purely imaginary values of s, i.e. for all physically meaningful values of s.

Conversion of traditional noise-type transfer functions (i.e. those represented by an equation of form (12)) to a form amenable to PVL techniques will now be discussed by way of non-limiting, illustrative examples for white noise, and later for general noise sources. We first consider the case in which the noise sources are all white, i.e. $S_{xx}$ is not a function of frequency. Using the new variable $s=j\omega$, equation (12) reduces to $$F(s)=L^T(G+sC)^{-1}BS_{xx}B^T(G+sC)^{-H}L. \tag{15}$$

Again using the new variable $s=j\omega$ and introducing the two new matrices u and v, equation $$F(s)=L^Tu,$$

$$v=(G+sC)^{-H}L,$$

$$u=(G+sC)^{-1}BS_{xx}B^T(G+sC)^{-H}L=(G+sC)^{-1}BS_{xx}B^Tv. \tag{16}$$

(16) may be rewritten as $$(G+sC)^Hv=L,$$

and $$(G+sC)u-BS_{xx}B^Tv=0 \tag{17}$$

The matrices u and v represent the solution of a coupled system of linear equations or, in matrix form $$\begin{bmatrix} 0 & (G+sC)^H \\ G+sC & -BS_{xx}B^T \end{bmatrix} \begin{bmatrix} u \\ v \end{bmatrix} = \begin{bmatrix} L \\ 0 \end{bmatrix}. \tag{18}$$

Equation (19) may be obtained from equations (16) and (18):

$$F(s) = \begin{bmatrix} L \\ 0 \end{bmatrix}^T \left( \begin{bmatrix} 0 & G^T \\ G & -BS_{xx}B^T \end{bmatrix} + s \begin{bmatrix} 0 & -C^T \\ C & 0 \end{bmatrix} \right)^{-1} \begin{bmatrix} L \\ 0 \end{bmatrix}. \tag{19}$$

As should be apparent, F(s) is exactly of the form of equation (14), and is therefore amenable to PVL reduction.

Unfortunately, as discussed hereinabove, not all noise sources are white. In order to be able to treat more general noise sources, the present invention considers a more general class of noise-type transfer functions—more precisely, noise-type transfer functions of the form $$F(s)=L^T(G+sC)^{-1}B(P(s))^{-1}B^T(G+sC)^{-H}L. \tag{21}$$

Here, L is a real N×p matrix, G and C are real N×N matrices, B is a real N×M matrix, and P(s) is a matrix polynomial of the form $$P(s)=P_0+P_1s+P_2s^2+\ldots+P_ms^m, \tag{22}$$

whose coefficients $P_i$ (where $i=0,1,\ldots,m$) are M×M matrices—assuming that $P_m$ is not the zero matrix, so that m is the degree of the matrix polynomial P(s). Equation (21) can express practically all noise power spectral densities of interest. The degree m itself can be arbitrary; however, the cases of low degree, such as m=0 and m=1, are the most important for circuit and system designers. For example, for m=0 and $P_0=S_{xx}^{-1}$, equation (21) reduces to the equation (15) of white noise. The flicker noise frequency-dependent power spectral density can also be well approximated by an expression of the form of equation (21) by expanding the denominator of equation (3) into a power series $$S_{ff}(\omega) = K_1 \frac{I^a}{(2\pi\omega)^b} = K_1 I^a (c_0 + c_1 s + c_2 s^2 + \ldots)^{-1}. \quad (23)$$

Rewriting the noise-type transfer function F(s) given by equation (21) in the form of equation (14) then permits Padé-based reduced-order model calculations for F(s) by simply applying the MPVL algorithm to equation (14) of F(s).

The inventive method advantageously transforms the general noise-type transfer function of equation (21) into a Padé amenable form as represented by equation (14). In transforming equation (21) to equation (14), let s be an arbitrary, but fixed purely imaginary number. Considering the linear system characterized by the matrix of (24):

$$\begin{vmatrix} 0 & (G+sC)^H & 0 & 0 & \ldots & \ldots & 0 \\ G+sC & 0 & B & 0 & 0 & \ldots & 0 \\ 0 & B^T & P_0+sP_1 & sP_2 & sP_3 & \ldots & sP_m \\ 0 & 0 & sI & -I & 0 & \ldots & 0 \\ \vdots & \vdots & 0 & sI & -I & \vdots & \vdots \\ \vdots & \vdots & \vdots & \vdots & \vdots & \vdots & 0 \\ 0 & \ldots & \ldots & 0 & 0 & sI & -I \end{vmatrix} \begin{vmatrix} x \\ y \\ z_1 \\ z_2 \\ z_3 \\ \vdots \\ z_m \end{vmatrix} = \begin{vmatrix} L \\ 0 \\ 0 \\ 0 \\ \vdots \\ \vdots \\ 0 \end{vmatrix} \quad (24)$$

From the last m−1 blocks of the equations in (24), it follows that $$z_i = sz_{i-1} \text{ for all } i=2,3,\ldots,m, \quad (25)$$

and thus $$z_i = s^{i-1} z_1 \text{ for all } i=2,3,\ldots,m, \quad (26)$$

Equation (27) may be derived using the third block of equations in the matrix of (24), together with equation (26) and equation (22) as follows:

$$\begin{aligned} B^T y &= -(P_0 + sP_1)z_1 + sP_2 z_2 + sP_3 z_3 + \ldots + sP_m z_m \quad (27) \\ &= -(P_0 + sP_1 + s^2 P_2 + \ldots + s^m P_m)z_1 \\ &= -P(s)z_1. \end{aligned}$$

The first two blocks of equations in (24) yield $$y = (G+sC)^{-H} L,$$

$$x = -(G+sC)^{-1} B z_1. \quad (28)$$

Combining equations (27) and (28) yields $$x = x(s) = (G+sC)^{-1} B(P(s))^{-1} B^T (G+sC)^{-H} L. \quad (29)$$

For purely imaginary values of s, the linear system characterized by the matrix of (24) can be rewritten as $$(\tilde{G} + s\tilde{C})\tilde{x} = \tilde{L}. \quad (30)$$

Here, $\tilde{x}$ and $\tilde{L}$ are $\tilde{N} \times p$ matrices defined by $$\tilde{x} = \begin{bmatrix} x \\ y \\ z_1 \\ \vdots \\ z_m \end{bmatrix} \text{ and } \tilde{L} = \begin{bmatrix} L \\ 0 \\ 0 \\ \vdots \\ 0 \end{bmatrix}, \quad (31)$$

and G and C are $\tilde{N} \times \tilde{N}$ matrices given by $$\tilde{G} = \begin{bmatrix} 0 & G^T & 0 & 0 & \cdots & 0 \\ G & 0 & B & 0 & \cdots & 0 \\ 0 & B^T & P_0 & 0 & \cdots & \vdots \\ 0 & 0 & 0 & -I & \cdots & 0 \\ \vdots & \vdots & \cdots & \cdots & \cdots & 0 \\ 0 & 0 & \cdots & 0 & 0 & -I \end{bmatrix} \quad (32)$$

and $$\tilde{C} = \begin{bmatrix} 0 & -C^T & 0 & 0 & \cdots & 0 \\ C & 0 & 0 & 0 & \cdots & 0 \\ 0 & 0 & P_1 & P_2 & \cdots & P_m \\ 0 & 0 & I & 0 & \cdots & 0 \\ \vdots & \vdots & \cdots & \cdots & \cdots & \vdots \\ 0 & 0 & \cdots & 0 & I & 0 \end{bmatrix} \quad (33)$$

Using equation (21) and the equations and matrices (29)–(31), it follows that $$\begin{aligned} F(s) &= L^T (G+sC)^{-1} B(P(s))^{-1} B^T (G+sC)^{-H} L \quad (34) \\ &= L^T x \\ &= \tilde{L}^T \tilde{x} \\ &= \tilde{L}^T (\tilde{G} + s\tilde{C})^{-1} \tilde{L}. \end{aligned}$$

This result demonstrates that, for purely imaginary values of s, the noise-type transfer function of equation (21) is indeed of the form of equation (14) with $\tilde{R} = \tilde{L}$, $\tilde{G}$, and $\tilde{C}$ as defined in matrices (31)–(33).

Of particular interest are the special cases where m=1 and where m=0 (i.e. white noise). For m=1, matrices with $\tilde{L}$, $\tilde{G}$, and $\tilde{C}$ reduce to $$\tilde{L} = \begin{bmatrix} L \\ 0 \\ 0 \end{bmatrix}, \tilde{G} = \begin{bmatrix} 0 & G^T & 0 \\ G & 0 & B \\ 0 & B^T & P_0 \end{bmatrix}, \text{ and } \tilde{C} = \begin{bmatrix} 0 & -C^T & 0 \\ C & 0 & 0 \\ 0 & 0 & P_1 \end{bmatrix}. \quad (35)$$

For m=0, all noise sources are white—as is the case for equation (15). This situation is addressed by the matrices of (35) with $P_0 = S_{xx}^{-1}$ and $P_1 = 0$. However, for m=0, the third block rows and columns of matrix (35) may be eliminated to yield $$\tilde{L} = \begin{bmatrix} L \\ 0 \end{bmatrix}, \tilde{G} = \begin{bmatrix} 0 & G^T \\ G & -B^T S_{xx}^{-1} B \end{bmatrix}, \text{ and } \tilde{C} = \begin{bmatrix} 0 & -C^T \\ C & 0 \end{bmatrix} \quad (36)$$

This is exactly the form arrived at in equation (19), which, as indicated hereinabove, is amenable to MPVL reduction.

Having thus shown how to reformulate the general noise-type transfer function F(s) given by equation (21) into the MPVL-amenable form of equation (14), it is straightforward to employ MPVL to generate reduced-order models for other transfer functions. It will be recalled that, as indicated hereinabove, $\tilde{R}=\tilde{L}$ in equation (14).

First, and in accordance with the present invention, a real expansion point $s_0$ is chosen such that $s=s_0+\sigma$. Equation (14) may then be rewritten as follows:

$$F(s_0 + \sigma) = \tilde{L}^T(\tilde{G} + \sigma\tilde{C})^{-1}\tilde{L} \qquad (37)$$
$$= (M_2^{-1}\tilde{L})^{-T}(I + \sigma M_1^{-1}\tilde{C}M_2^{-1})^{-1}(M_1^{-1}\tilde{L}).$$

Here, $M_1$ and $M_2$ are the factors of a factorization representing, respectively, lower and upper triangular matrices:

$$\tilde{G}+s_0\tilde{C}=M_1*M_2. \qquad (38)$$

A suitable block version of the Lanczos process may then be applied to the matrix $A=M_1^{-1}\tilde{C}M_2^{-1}$ using $M_1^{-1}\tilde{L}$ and $M_2^{-1}\tilde{L}$ as the respective right and left blocks of starting vectors. After executing such a Lanczos process for n iterations, an n×n banded matrix $T_n$ is obtained such that the function $$F_n(s_0+\sigma)=\eta^T(I+\sigma T_n)^{-1}\rho \qquad (39)$$

provides a frequency-dependent noise approximation for any electronic circuit or system and is an n-th matrix-Padé approximant to $F(s_0+\sigma)$. In (39), $\rho$ and $\eta$ are n×p matrices that contain the Lanczos recurrence coefficients for processing right and left starting blocks $M_1^{-1}\tilde{L}$ and $M_2^{-1}\tilde{L}$. Note that, $F_n(s_0+\sigma)$ is a rational matrix-function of $\sigma$ of order n. For example, in the single-output case, i.e. p=1, $F_n(s_0+\sigma)$ is a scalar rational function having a numerator polynomial of no more than n−1 degrees and a denominator polynomial of no more than n degrees such that $$F_n(s_0+\sigma)=F(s_0+\sigma)+\theta(n^{q(n)}), \qquad (40)$$

where q(n)=2n. It will be noted that equation (40) indicates that the Taylor expansions of $F_n$ and F about the expansion point $s_0$ agree in as many leading Taylor coefficients as possible.

Note also that all quantities involved in the Lanczos-type process are real, as long as the coefficient matrices of $P_0$, $P_1$, ..., $P_m$ of equation (22) are real, which is typically the case.

In accordance with a novel and advantageous feature of the present invention, the reduced-order model for the noise spectral density of a circuit module will always have the form of equation (39), which results from the MPVL algorithm. If the reduced-order models of circuit modules calculated in accordance with the inventive method are used in higher-level simulations, i.e. hierarchical modeling, then $S_{xx}(s)$ is computed using equation (39). The resulting output noise power cross-spectral density matrix of the circuit will have the form:

$$F(s)=L^T(G+sC)^{-1}B(P_0+sP_1)^{-1}B^T(G+sC)^{-H}L, \qquad (41)$$

which is compatible with MPVL, as shown hereinabove for the matrices of (35) for the case where m=1.

Finally, and with respect to properties of the MPVL algorithm specific to its application to noise-type problems, if the function F(s) describes the noise of a circuit, then P(s) of equation (22) needs to be such that $$F(j\omega)=L^T(G+j\omega C)^{-1}B(P(j\omega))^{-1}B^T(G+j\omega C)^{-H}L>0 \text{ for all } \omega>0. \qquad (43)$$

Ideally, the MPVL algorithm is executed on the noise-type transfer function in accordance with the present invention until the matrix-Padé approximant $F_n$ has converged to F in the frequency case of interest. This can be used to show that (43) is satisfied at least approximately. This observation is important when using the reduced-order model calculated in accordance with the present invention hierarchically as noise sources in a high-level simulation.

It will be appreciated by persons skilled in the art that the inventive application of MPVL based model-reduction techniques to noise modeling and analysis as discussed hereinabove simplifies in the case of a single output, i.e. p=1, only. In this case, $\tilde{L}$ becomes a vector and PVL will be used instead of MPVL.

Figure 1A:
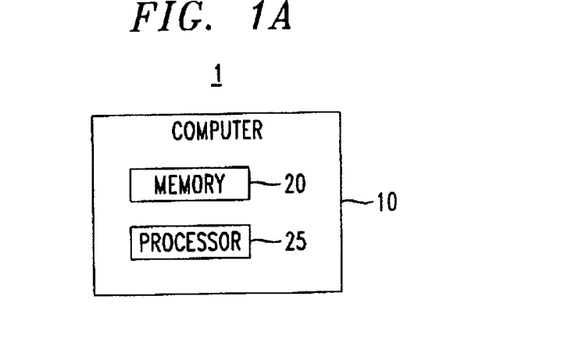
FIG. 1a is a simulator for approximating a noise power cross-spectral density matrix in accordance with the present invention.

The simulator for approximating a noise power cross-spectral density matrix in accordance with the invention is shown in FIG. 1a. Simulator 1 includes a computer 10 having a memory 20 and a processor 25. A model of a noise transfer function in computer-readable form is loaded into the memory 20. Processor 25 transforms the noise transfer function model to a form that is amenable to matrix-Padé approximation techniques, applies Matrix-Padé via Lanczos manipulations to the matrix-Padé amenable noise transfer function, and generates a reduced-order model of the noise power cross-spectral density representing an approximation of the noise power cross-spectral density of the electronic circuit. The reduced-order model of the noise power cross-spectral density is used to simulate the electronic circuit.

Figure 1B:
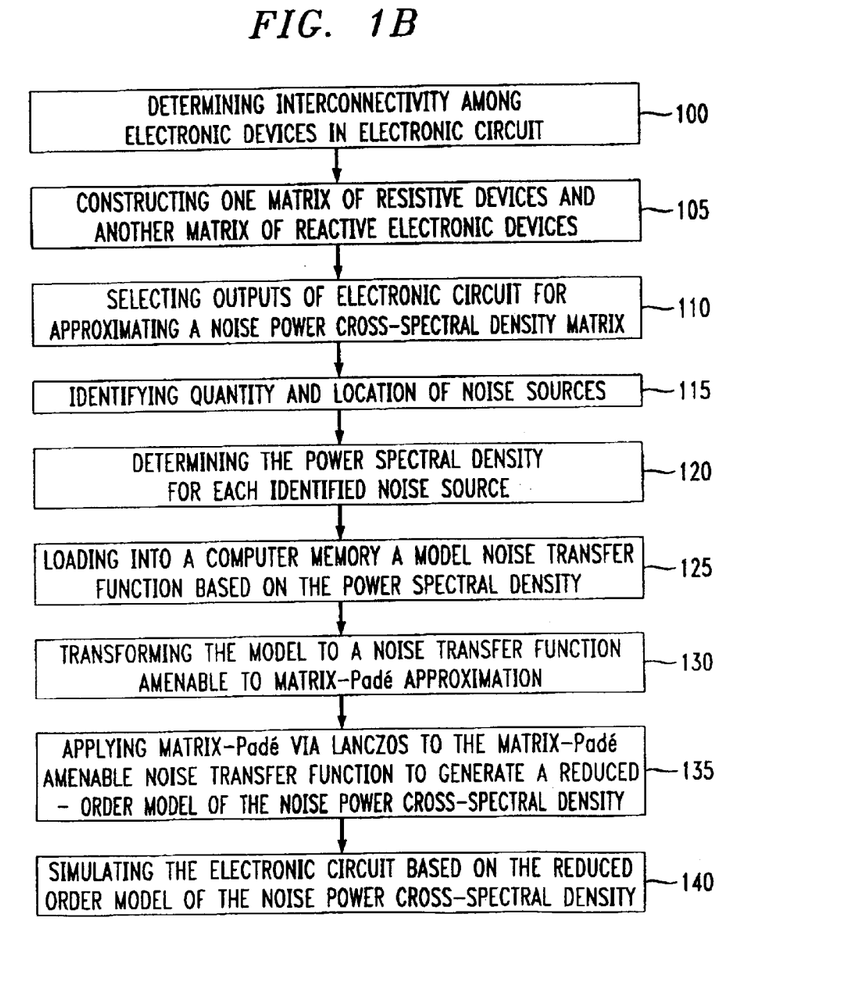
FIG. 1b represents a flow chart of the method of approximating a noise power cross-spectral density matrix of an electronic circuit in accordance with the present invention.

A flow chart of the inventive method of approximating a noise power cross-spectral density matrix of an electronic circuit is shown in FIG. 1b. Initially, in step 100 a determination is made of the interconnectivity among the electronic devices in the electronic circuit. Then, in step 105 a first matrix of resistive electronic devices and a second matrix of reactive electronic devices is constructed. Outputs of the electronic circuit are selected, in step 110, for approximating a noise power cross-spectral density matrix and the quantity and location of noise sources in the electronic circuit are identified in step 115. Thereafter, in step 120 the power spectral density for each identified noise source is identified. A model noise transfer function based on the power spectral density is loaded into a computer memory in step 125. The model noise transfer function is then transformed in step 135 to a noise transfer function amenable to matrix-Padé approximation. Then, in step 135 Matrix-Padé via Lanczos is applied to the matrix-Padé amenable noise transfer function to generate a reduced-order model of the noise power cross-spectral density. The electronic circuit is simulated, in step 140, based on the reduced-order model of the noise power cross-spectral density.

Illustrative Examples

Application of the inventive method will now be described with reference to the following illustrative, non-limiting examples.

741 Operational Amplifier

Figure 2:
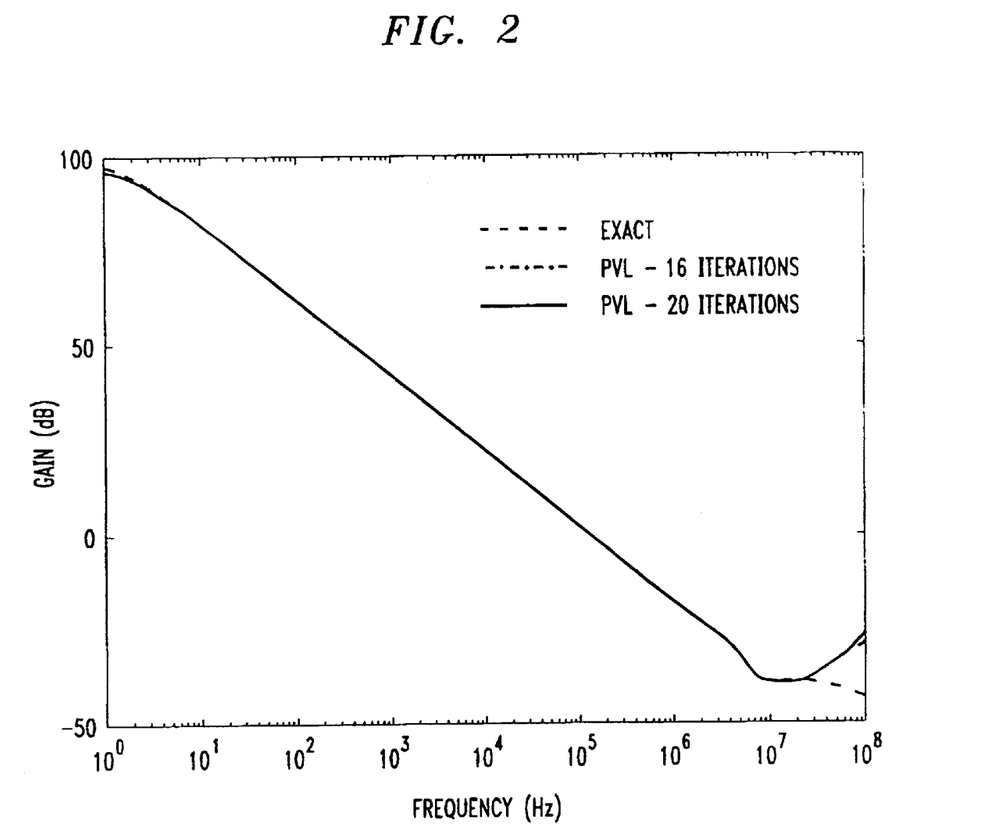
FIG. 2 graphically compares the transfer function of an operational amplifier calculated using prior art methods with the transfer function calculated in accordance with the present invention.
Figure 3:
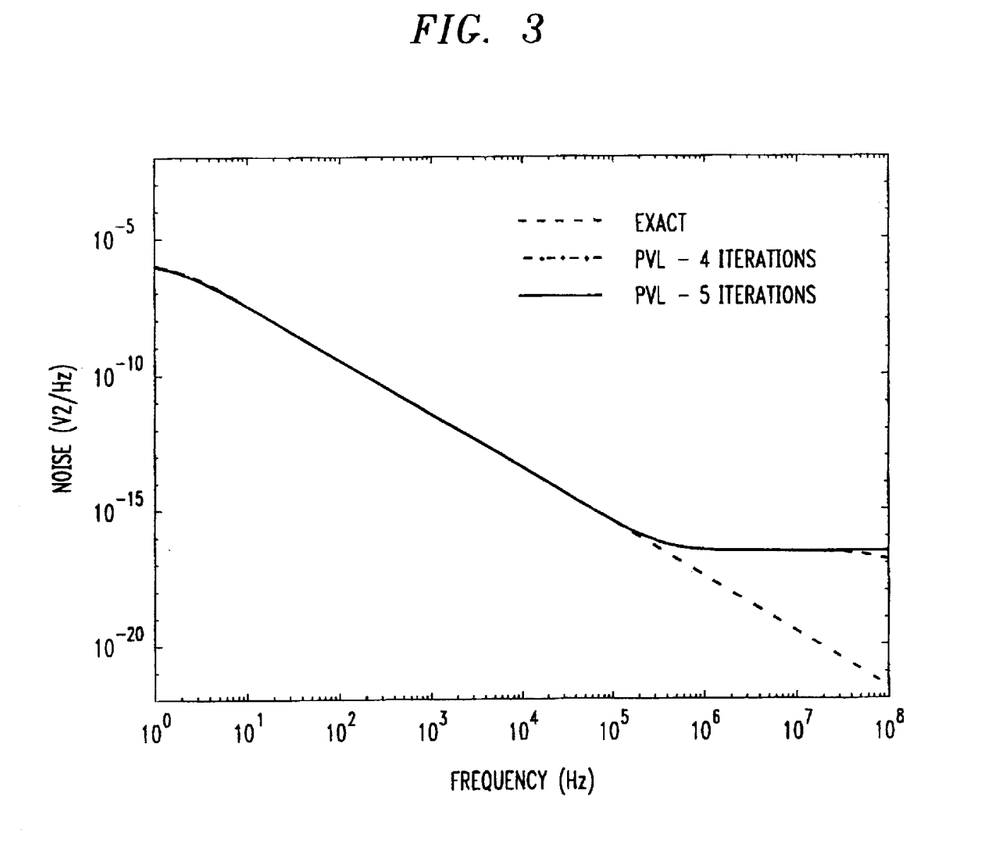
FIG. 3 graphically compares the output noise spectral density of an operational amplifier calculated using prior art methods with the output noise spectral density calculated in accordance with the present invention.

For a 741 operational amplifier ("opamp"), the size of the problem, i.e. the size of the circuit and matrices, is 55 variables, and p=1. FIG. 2 shows the exact transfer function of the amplifier, i.e. calculated using prior art methods, compared to the PVL reduced-order models of orders 16 and 20. The order 20 approximation captures the behavior of the amplifier almost exactly. FIG. 3 shows the amplifier output noise power spectral density plotted over the same frequency range. Here, a Padé approximation of order 5 is seen to be sufficient to capture the noise spectrum whereas prior art methods may require hundreds of evaluations of the noise function.

Cauer Filter

Figure 4:
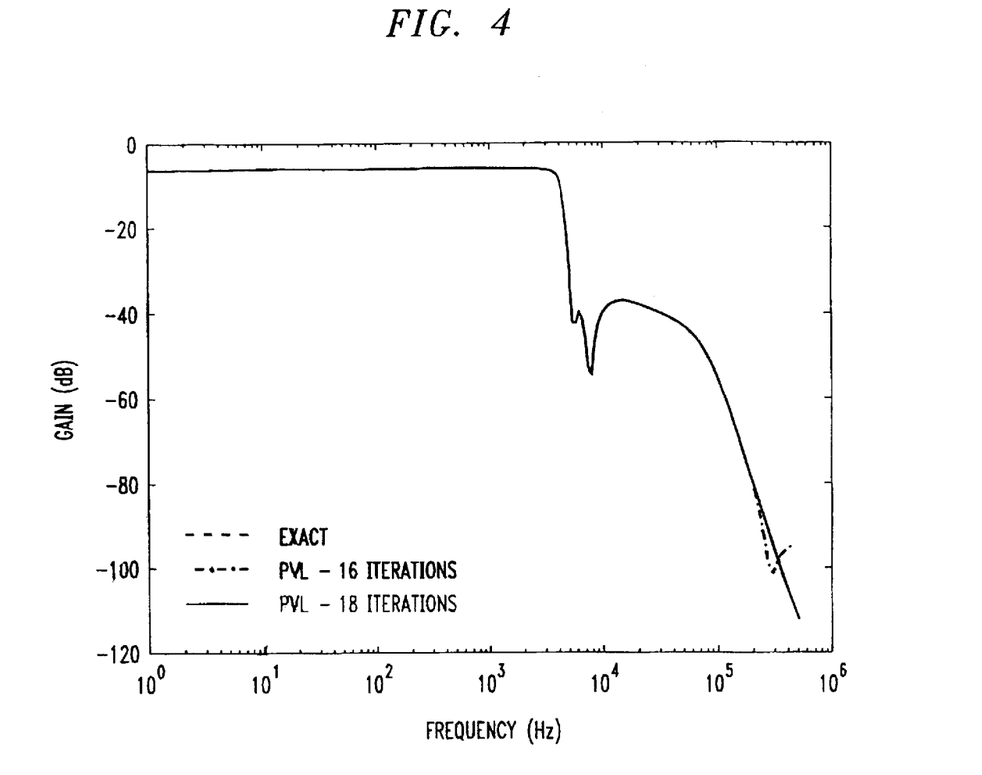
FIG. 4 graphically compares the transfer function of a Cauer filter calculated using prior art methods with the transfer function calculated in accordance with the present invention.
Figure 5:
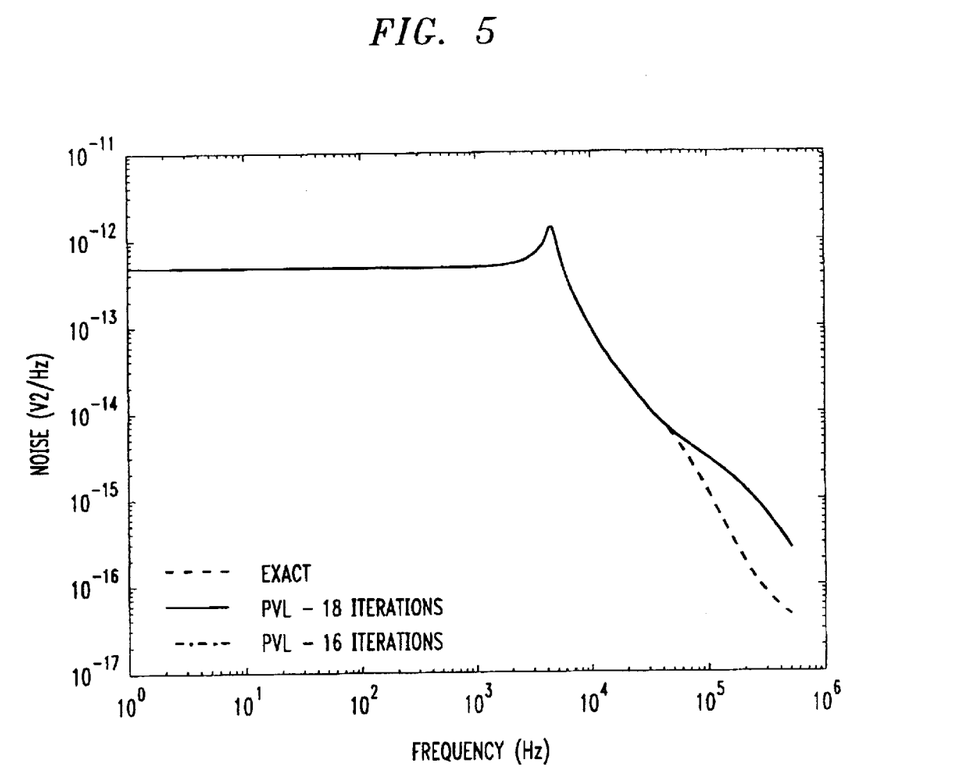
FIG. 5 graphically compares the output noise spectral density of a Cauer filter calculated using prior art methods with the output noise spectral density calculated in accordance with the present invention.

The next example is a fifth order Cauer filter that uses ten 741 opamps as building blocks. The total size of the problem is 463 variables. FIGS. 4 and 5 depict, respectively, the transfer function and the output noise spectrum calculated using both prior art methods and the method of the present invention. It can be seen that approximately the same number of iterations of each method are required to obtain an almost perfect match of both the transfer function and noise spectrum.

Chebyshev Bandpass Filter

Figure 6:
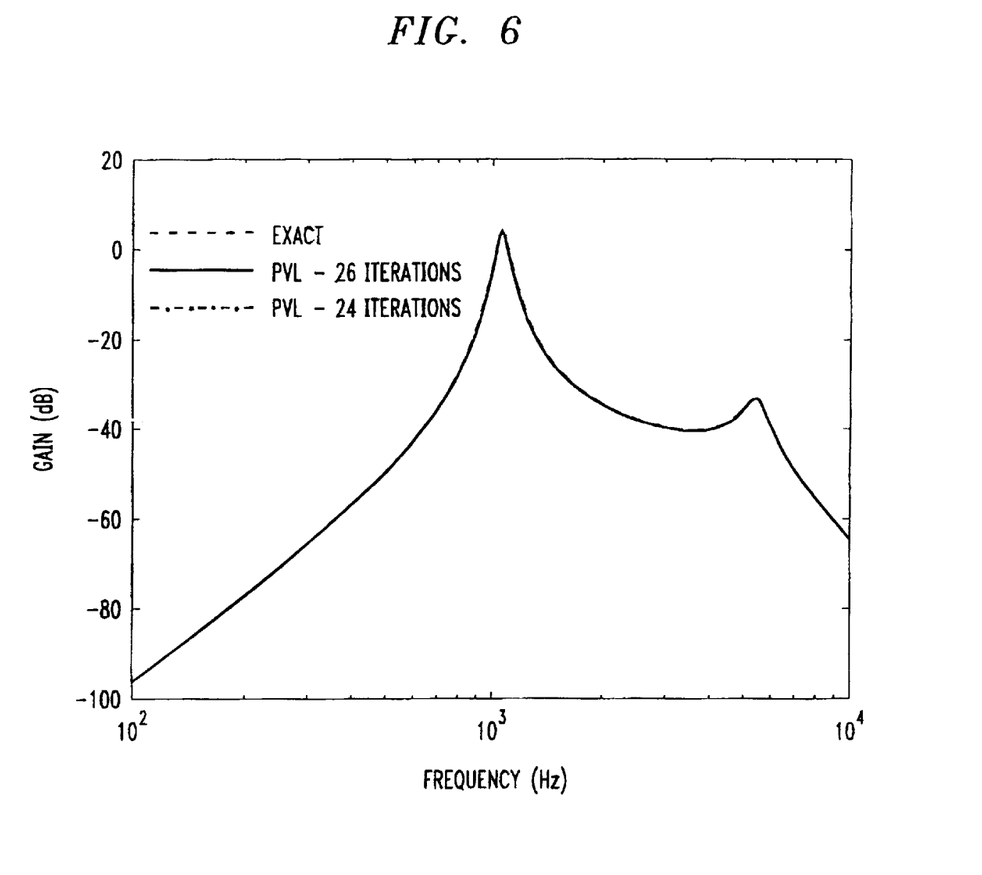
FIG. 6 graphically compares the transfer function of a Chebyshev filter calculated using prior art methods with the transfer function calculated in accordance with the present invention.
Figure 7:
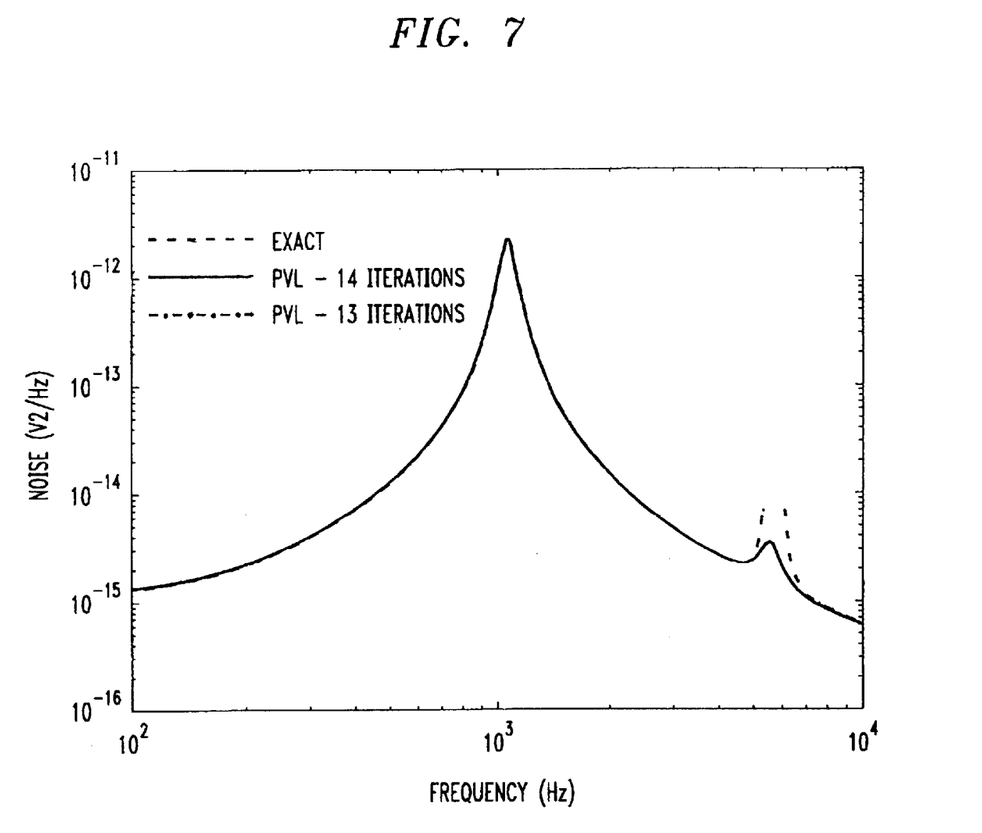
FIG. 7 graphically compares the output noise spectral density of a Chebyshev filter calculated using prior art methods with the output noise spectral density calculated in accordance with the present invention.

The final example is a bandpass filter derived from a third-order Chebyshev low-pass prototype, and implemented with single amplifier biquads using the 741 opamp as a building block. The problem size is 147 variables. FIGS. 6 and 7 show the transfer function and output noise spectrum, respectively, calculated using prior art techniques and PVL techniques in accordance with the present invention. It can be seen that approximately 18 iterations are required to match the transfer function and only 14 to match the noise spectrum obtained using the prior art techniques.

Thus, while there have shown and described and pointed out fundamental novel features of the invention as applied to preferred embodiments thereof, it will be understood that various omissions and substitutions and changes in the form and details of the methods herein described, and in their practice and operation, may be made by those skilled in the art without departing from the spirit of the invention. For example, it is expressly intended that all combinations of those elements and/or method steps that perform substantially the same function in substantially the same way to achieve the same results are within the scope of the invention. It is the intention, therefore, to be limited only as indicated by the scope of the claims appended hereto.

What is claimed is:

1. A method of approximating a noise power cross-spectral density matrix of an electronic circuit formed of a plurality of electronic devices connected in a predetermined configuration, said method comprising the steps of:
   (a) loading into a computer memory a model of a noise transfer function for the electronic circuit that is in a computer-readable form;
   (b) transforming the loaded model to a noise transfer function having a form that is amenable to matrix-Padé approximation; and
   (c) applying Matrix-Padé via Lanczos manipulations to the matrix-Padé amenable noise transfer function to generate a reduced-order model of the noise power cross-spectral density of the electronic circuit, said reduced-order model representing an approximation of the noise power cross-spectral density of the electronic circuit.

2. The method of claim 1, further comprising the step of simulating said electronic circuit based on said reduced-order model of the noise power cross-spectral density.

3. The method of claim 1, wherein said loaded model is defined by $$F(s) = L^T(G+sC)^{-1}B(P(s))^{-1}B^T(G+sC)^{-H}L$$

where $s = j\omega$,

L is a real N×p matrix,

G and C are real N×p matrices,

B is a real N×M matrix, and

P(s) is a predefined matrix polynomial.

4. The method of claim 1, wherein the transformed matrix-Padé amenable noise transfer function is defined by $$F(s) = \tilde{L}^T(\tilde{G}+s\tilde{C})^{-1}\tilde{L}$$

where $s = j\omega$, $\tilde{L}$ is a real matrix of size $\tilde{N} \times p$, $\tilde{G}$ is an $\tilde{N} \times \tilde{N}$ matrix representing resistive electronic devices and noise source information for the electronic circuit, and $\tilde{C}$ is an $\tilde{N} \times \tilde{N}$ matrix representing reactive electronic devices and noise source information for the electronic circuit.

5. The method of claim 4, wherein $\tilde{G}$ is a matrix defined by $$\tilde{G} = \begin{bmatrix} 0 & G^T & 0 & 0 & \cdots & 0 \\ G & 0 & B & 0 & \cdots & 0 \\ 0 & B^T & P_0 & 0 & \ddots & \vdots \\ 0 & 0 & 0 & -I & \ddots & 0 \\ \vdots & \vdots & \ddots & \ddots & \ddots & 0 \\ 0 & 0 & \cdots & 0 & 0 & -I \end{bmatrix}$$

and $\tilde{C}$ is a matrix defined by $$\tilde{C} = \begin{bmatrix} 0 & -C^T & 0 & 0 & \cdots & 0 \\ C & 0 & 0 & 0 & \cdots & 0 \\ 0 & 0 & P_1 & P_2 & \cdots & P_m \\ 0 & 0 & I & 0 & \cdots & 0 \\ \vdots & \vdots & \ddots & \ddots & \ddots & \vdots \\ 0 & 0 & \cdots & 0 & I & 0 \end{bmatrix}.$$

6. The method of claim 3, wherein said predefined matrix polynomial is defined by $$P(s) = P_0 + P_1 s + P_2 s^2 + \ldots + P_m s^m,$$

where m is the degree of said predefined matrix polynomial, the coefficients $P_i$ are M×M matrices where $i = 0, 1, \ldots, m$, and $P_m$ is not the zero matrix.

7. The method of claim 1, wherein said reduced-order model of the noise transfer function for the electronic circuit is defined by $$F_n(s_0+\sigma) = \eta^T(I+\sigma T_n)^{-1}\rho$$

where $\rho$ and $\eta$ are n×p matrices that contain the recurrence coefficients for processing right and left starting blocks of the Lanczos-type process, I is the n×n identity matrix, $T_n$ is an n×n banded matrix generated by n steps of the Lanczos-type process, $\sigma$ is a function of frequency.

8. The method of claim 1, wherein said loading step comprises:
   (d) determining interconnectivity among the electronic devices in the electronic circuit;

(e) constructing a plurality of matrices representing a plurality of discrete characteristics of the electronic circuit based on the interconnectivity among the electronic devices;

(f) selecting outputs of the electronic circuit at which the noise power cross-spectral density matrix will be approximated;

(g) identifying quantity and location of noise sources in the electronic circuit; and (h) determining the power spectral density for each identified noise source.

9. The method of claim 8, wherein said constructing step comprises:

(i) constructing a first matrix representing resistive electronic devices in the electronic circuit; and (j) constructing a second matrix representing reactive electronic devices in the electronic circuit.

10. A method for hierarchically approximating a noise power cross-spectral density matrix for an electronic system having a predetermined number of interconnected electronic circuits each formed of a plurality of electronic devices connected in a predetermined configuration, said method comprising the steps of:

(a) approximating the noise power cross-spectral density matrix for one of the electronic circuits in the electronic system;

(b) loading into a computer memory a model of a noise transfer function for the electronic system that is in a computer-readable form, said approximated noise power cross-spectral density matrix being used as inputs when loading said noise transfer function;

(c) transforming the loaded model to a noise transfer function having a form that is amenable to matrix-Padé approximation; and (d) applying Matrix-Padé via Lanczos manipulation to the transformed matrix-Padé amenable noise transfer function to generate a reduced-order model of the noise transfer function for the electronic system, said reduced-order model representing a hierarchical approximation of the noise power cross-spectral density of the electronic system.

11. The method of claim 10, further comprising the step of simulating said electronic system based on said reduced-order model of the noise power cross-spectral density.

12. The method of claim 10, wherein said approximating step comprises:

(e) constructing a model of a noise transfer function for said one electronic circuit;

(f) transforming the model constructed in said constructing step to a noise transfer function having a form that is amenable to matrix-Padé approximation; and (g) applying Matrix-Padé via Lanczos manipulation to the transformed matrix-Padé amenable noise transfer function to generate a reduced-order model of the noise transfer function for said one electronic circuit, said reduced-order model representing an approximation of the noise power cross-spectral density matrix of said one electronic circuit.

13. The method of claim 12, wherein said model constructed in said constructing step (e) is defined by $$F(s)=L^T(G+sC)^{-1}B(P(s))^{-1}B^T(G+sC)^{-H}L$$

where $s=j\omega$,

L is a real N×p matrix,

G and C are real N×p matrices,

B is a real N×M matrix, and

P(s) is a predefined matrix polynomial.

14. The method of claim 12, wherein the matrix-Padé amenable noise transfer function of said transforming step (f) is defined by $$F(s)=\tilde{L}^T(\tilde{G}+s\tilde{C})^{-1}\tilde{L}$$

where $s=j\omega$, $\tilde{L}$ is a real matrix of size $\tilde{N}\times p$, $\tilde{G}$ is an $\tilde{N}\times\tilde{N}$ matrix representing resistive electronic devices and noise source information for the electronic circuit, and $\tilde{C}$ is an $\tilde{N}\times\tilde{N}$ matrix representing reactive electronic devices and noise source information for the electronic circuit.

15. The method of claim 14, wherein $\tilde{G}$ is a matrix defined by $$\tilde{G}=\begin{bmatrix} 0 & G^T & 0 & 0 & \cdots & 0 \\ G & 0 & B & 0 & \cdots & 0 \\ 0 & B^T & P_0 & 0 & \ddots & \vdots \\ 0 & 0 & 0 & -I & \ddots & 0 \\ \vdots & \vdots & \ddots & \ddots & \ddots & 0 \\ 0 & 0 & \cdots & 0 & 0 & -I \end{bmatrix}$$

and $\tilde{C}$ is a matrix defined by $$\tilde{C}=\begin{bmatrix} 0 & -C^T & 0 & 0 & \cdots & 0 \\ C & 0 & 0 & 0 & \cdots & 0 \\ 0 & 0 & P_1 & P_2 & \cdots & P_m \\ 0 & 0 & I & 0 & \cdots & 0 \\ \vdots & \vdots & \ddots & \ddots & \ddots & \vdots \\ 0 & 0 & \cdots & 0 & I & 0 \end{bmatrix}.$$

16. The method of claim 14, wherein said predefined matrix polynomial is defined by $$P(s)=P_0+P_1s+P_2s^2+\ldots+P_ms^m,$$

where m is the degree of said predefined matrix polynomial, the coefficients $P_i$ are M×M matrices where i=0, 1, ..., m, and $P_m$ is not the zero matrix.

17. The method of claim 10, wherein said reduced-order model of the noise transfer function for the electronic system generated in said applying step is defined by $$F_n(s_0+\sigma)=\eta^T(I+\sigma T_n)^{-1}\rho$$

where $\rho$ and $\eta$ are n×p matrices that contain the recurrence coefficients for processing right and left starting blocks of the Lanczos-type process, I is the n×n identity matrix, $T_n$ is an n×n banded matrix generated by n steps of the Lanczos-type process, $\sigma$ is a function of frequency.

18. The method of claim 12, wherein said reduced-order model of the noise transfer function for said one electronic circuit generated in said applying step (g) is defined by $$F_n(s_0+\sigma)=\eta^T(I+\sigma T_n)^{-1}\rho$$

where
- $\rho$ and $\eta$ are n×p matrices that contain the recurrence coefficients for processing right and left starting blocks of the Lanczos-type process,
- I is the n×n identity matrix,
- $T_n$ is an n×n banded matrix generated by n steps of the Lanczos-type process,
- $\sigma$ is a function of frequency.

19. The method of claim 12, wherein said constructing step comprises:
   (h) determining interconnectivity among the electronic devices in said one electronic circuit;
   (i) constructing a plurality of matrices representing a plurality of discrete characteristics of said one electronic circuit and based on the interconnectivity among the electronic devices of said one electronic circuit;
   (j) selecting outputs of said one electronic circuit at which the noise power cross-spectral density matrix will be approximated;
   (k) identifying quantity and location of noise sources in said one electronic circuit; and
   (l) determining the power spectral density for each identified noise source.

20. The method of claim 19 wherein said step (i) comprises:
   (m) constructing a first matrix representing resistive electronic devices in said one electronic circuit; and
   (n) constructing a second matrix representing reactive electronic devices in said one electronic circuit.

21. A simulator for approximating a noise power cross-spectral density matrix of an electronic circuit formed of a plurality of electronic devices connected in a predetermined configuration, comprising:
   (a) a computer memory for storing a model of a noise transfer function for the electronic circuit that is in computer-readable form; and
   (b) a processor for transforming the model to a noise transfer function having a form that is amenable to matrix-Padé approximation, applying Matrix-Padé via Lanczos manipulations to the matrix-Padé amenable noise transfer function, and generating a reduced-order model of the noise power cross-spectral density of the electronic circuit, said reduced-order model representing an approximation of the noise power cross-spectral density of the electronic circuit.

22. The simulator of claim 21, wherein said processor simulates said electronic circuit based on said reduced-order model of the noise power cross-spectral density.

23. The simulator of claim 21, wherein the model is defined by $$F(s)=L^T(G+sC)^{-1}B(P(s))^{-1}B^T(G+sC)^{-H}L$$

where
- $s=j\omega$,
- L is a real N×p matrix,
- G and C are real N×p matrices,
- B is a real N×M matrix, and
- P(s) is a predefined matrix polynomial.

24. The simulator of claim 21, wherein the transformed matrix-Padé amenable noise transfer function is defined by $$F(s)=\tilde{L}^T(\tilde{G}+s\tilde{C})^{-1}\tilde{L}$$

where
- $s=j\omega$,
- $\tilde{L}$ is a real matrix of size $\tilde{N}\times p$,
- $\tilde{G}$ is an $\tilde{N}\times\tilde{N}$ matrix representing resistive electronic devices and noise source information for the electronic circuit, and
- $\tilde{C}$ is an $\tilde{N}\times\tilde{N}$ matrix representing reactive electronic devices and noise source information for the electronic circuit.

25. The simulator of claim 24, wherein $\tilde{G}$ is a matrix defined by $$\tilde{G}=\begin{bmatrix} 0 & G^T & 0 & 0 & \cdots & 0 \\ G & 0 & B & 0 & \cdots & 0 \\ 0 & B^T & P_0 & 0 & \ddots & \vdots \\ 0 & 0 & 0 & -I & \ddots & 0 \\ \vdots & \vdots & \ddots & \ddots & \ddots & 0 \\ 0 & 0 & \cdots & 0 & 0 & -I \end{bmatrix}$$

and $\tilde{C}$ is a matrix defined by $$\tilde{C}=\begin{bmatrix} 0 & -C^T & 0 & 0 & \cdots & 0 \\ C & 0 & 0 & 0 & \cdots & 0 \\ 0 & 0 & P_1 & P_2 & \cdots & P_m \\ 0 & 0 & I & 0 & \cdots & 0 \\ \vdots & \vdots & \ddots & \ddots & \ddots & \vdots \\ 0 & 0 & \cdots & 0 & I & 0 \end{bmatrix}.$$

26. The simulator of claim 23, wherein said predefined matrix polynomial is defined by $$P(s)=P_0+P_1s+P_2s^2+\ldots+P_ms^m,$$

where
- m is the degree of said predefined matrix polynomial,
- the coefficients $P_i$ are M×M matrices where i=0 1, ..., m, and
- $P_m$ is not the zero matrix.

27. The simulator of claim 21, wherein said reduced-order model of the noise transfer function for the electronic circuit is defined by $$F_n(s_0+\sigma)=\eta^T(I+\sigma T_n)^{-1}\rho$$

where
- $\rho$ and $\eta$ are n×p matrices that contain the recurrence coefficients for processing right and left starting blocks of the Lanczos-type process,
- I is the n×n identity matrix,
- $T_n$ is an n×n banded matrix generated by n steps of the Lanczos-type process,
- $\sigma$ is a function of frequency.

28. A simulator for hierarchically approximating a noise power cross-spectral density matrix for an electronic system having a predetermined number of interconnected electronic circuits each formed of a plurality of electronic devices connected in a predetermined configuration, comprising:

a computer memory for loading a model of a noise transfer function for the electronic system that is in a computer-readable form based on an approximated noise power cross-spectral density matrix for one of the electronic circuits in the electronic system; and a processor for transforming the loaded model to a noise transfer function having a form that is amenable to matrix-Padé approximation, applying Matrix-Padé via Lanczos manipulation to the transformed matrix-Padé amenable noise transfer function to generate a reduced-order model of the noise transfer function for the electronic system representing a hierarchical approximation of the noise power cross-spectral density of the electronic system.

29. The simulator of claim 28, wherein said processor simulates said electronic system based on said reduced-order model of the noise power cross-spectral density.

30. The simulator of claim 28, wherein said model is defined by $$F(s)=L^T(G+sC)^{-1}B(P(s))^{-1}B^T(G+sC)^{-H}L$$

where
s=jω,
L is a real N×p matrix,
G and C are real N×p matrices,
B is a real N×M matrix, and
P(s) is a predefined matrix polynomial.

31. The simulator of claim 28, wherein the matrix-Padé amenable noise transfer function is defined by $$F(s)=\tilde{L}^T(\tilde{G}+s\tilde{C})^{-1}\tilde{L}$$

where
s=jω,
$\tilde{L}$ is a real matrix of size $\tilde{N}\times p$,
$\tilde{G}$ is an $\tilde{N}\times\tilde{N}$ matrix representing resistive electronic devices and noise source information for the electronic circuit, and
$\tilde{C}$ is an $\tilde{N}\times\tilde{N}$ matrix representing reactive electronic devices and noise source information for the electronic circuit.

32. The simulator of claim 31, wherein $\tilde{G}$ is a matrix defined by $$\tilde{G} = \begin{bmatrix} 0 & G^T & 0 & 0 & \cdots & 0 \\ G & 0 & B & 0 & \cdots & 0 \\ 0 & B^T & P_0 & 0 & \ddots & \vdots \\ 0 & 0 & 0 & -I & \ddots & 0 \\ \vdots & \vdots & \ddots & \ddots & \ddots & 0 \\ 0 & 0 & \cdots & 0 & 0 & -I \end{bmatrix}$$

and $\tilde{C}$ is a matrix defined by $$\tilde{C} = \begin{bmatrix} 0 & -C^T & 0 & 0 & \cdots & 0 \\ C & 0 & 0 & 0 & \cdots & 0 \\ 0 & 0 & P_1 & P_2 & \cdots & P_m \\ 0 & 0 & I & 0 & \cdots & 0 \\ \vdots & \vdots & \ddots & \ddots & \ddots & \vdots \\ 0 & 0 & \cdots & 0 & I & 0 \end{bmatrix}.$$

33. The simulator of claim 30, wherein said predefined matrix polynomial is defined by $$P(s)=P_0+P_1s+P_2s^2+\ldots+P_ms^m,$$

where
m is the degree of said predefined matrix polynomial,
the coefficients $P_i$ are M×M matrices where i=0, 1, ..., m, and
$P_m$ is not the zero matrix.

34. The simulator of claim 28, wherein said reduced-order model of the noise transfer function for the electronic system is defined by $$F_n(s_0+\sigma)=\eta^T(I+\sigma T_n)^{-1}\rho$$

where
ρ and η are n×p matrices that contain the recurrence coefficients for processing right and left starting blocks of the Lanczos-type process,
I is the n×n identity matrix,
$T_n$ is an n×n banded matrix generated by n steps of the Lanczos-type process,
σ is a function of frequency.

35. A simulator for approximating a noise power cross-spectral density matrix of an electronic circuit formed of a plurality of electronic devices connected in a predetermined configuration, comprising:

means for loading into a computer memory a model of a noise transfer function for the electronic circuit that is in a computer-readable form;

means for transforming the loaded model to a noise transfer function having a form that is amenable to matrix-Padé approximation; and means for applying Matrix-Padé via Lanczos manipulations to the matrix-Padé amenable noise transfer function to generate a reduced-order model of the noise power cross-spectral density of the electronic circuit, said reduced-order model representing an approximation of the noise power cross-spectral density of the electronic circuit.

36. The simulator of claim 35, further comprising means for simulating said electronic circuit based on said reduced-order model of the noise power cross-spectral density.

37. The simulator of claim 35, wherein said loaded model is defined by $$F(s)=L^T(G+sC)^{-1}B(P(s))^{-1}B^T(G+sC)^{-H}L$$

where
s=jω,
L is a real N×p matrix,
G and C are real N×p matrices,
B is a real N×M matrix, and
P(s) is a predefined matrix polynomial.

38. The simulator of claim 35, wherein the transformed matrix-Padé amenable noise transfer function is defined by $$F(s)=\tilde{L}^T(\tilde{G}+s\tilde{C})^{-1}\tilde{L}$$

where
s=jω,
$\tilde{L}$ is a real matrix of size $\tilde{N}\times p$,
$\tilde{G}$ is an $\tilde{N}\times\tilde{N}$ matrix representing resistive electronic devices and noise source information for the electronic circuit, and
$\tilde{C}$ is an $\tilde{N}\times\tilde{N}$ matrix representing reactive electronic devices and noise source information for the electronic circuit.

39. The simulator of claim 38, wherein $\tilde{G}$ is a matrix defined by $$\tilde{G} = \begin{bmatrix} 0 & G^T & 0 & 0 & \cdots & 0 \\ G & 0 & B & 0 & \cdots & 0 \\ 0 & B^T & P_0 & 0 & \ddots & \vdots \\ 0 & 0 & 0 & -I & \ddots & 0 \\ \vdots & \vdots & \ddots & \ddots & \ddots & 0 \\ 0 & 0 & \cdots & 0 & 0 & -I \end{bmatrix}$$

and $\tilde{C}$ is a matrix defined by $$\tilde{C} = \begin{bmatrix} 0 & -C^T & 0 & 0 & \cdots & 0 \\ C & 0 & 0 & 0 & \cdots & 0 \\ 0 & 0 & P_1 & P_2 & \cdots & P_m \\ 0 & 0 & I & 0 & \cdots & 0 \\ \vdots & \vdots & \ddots & \ddots & \ddots & \vdots \\ 0 & 0 & \cdots & 0 & I & 0 \end{bmatrix}.$$

40. The simulator of claim 37, wherein said predefined matrix polynomial is defined by $$P(s) = P_0 + P_1 s + P_2 s^2 + \ldots + P_m s^m,$$

where m is the degree of said predefined matrix polynomial, the coefficients $P_i$ are M×M matrices where i=0, 1, . . . , m, and $P_m$ is not the zero matrix.

41. The method of claim 35, wherein said reduced-order model of the noise transfer function for the electronic circuit is defined by $$F_n(s_0+\sigma) = \eta^T (I+\sigma T_n)^{-1} \rho$$

where

ρ and η are n×p matrices that contain the recurrence coefficients for processing right and left starting blocks of the Lanczos-type process, I is the n×n identity matrix, $T_n$ is an n×n banded matrix generated by n steps of the Lanczos-type process, σ is a function of frequency.

42. The simulator of claim 35, wherein said loading means comprises:

means for determining interconnectivity among the electronic devices in the electronic circuit;

means for constructing a plurality of matrices representing a plurality of discrete characteristics of the electronic circuit based on the interconnectivity among the electronic devices;

means for selecting outputs of the electronic circuit at which the noise power cross-spectral density matrix will be approximated;

means for identifying quantity and location of noise sources in the electronic circuit; and means for determining the power spectral density for each identified noise source.

43. The simulator of claim 42, wherein said constructing means comprises:

means for constructing a first matrix representing resistive electronic devices in the electronic circuit; and means for constructing a second matrix representing reactive electronic devices in the electronic circuit.

44. A simulator for hierarchically approximating a noise power cross-spectral density matrix for an electronic system having a predetermined number of interconnected electronic circuits each formed of a plurality of electronic devices connected in a predetermined configuration, comprising:

means for approximating the noise power cross-spectral density matrix for one of the electronic circuits in the electronic system;

means for loading into a computer memory a model of a noise transfer function for the electronic system that is in a computer-readable form, said approximated noise power cross-spectral density matrix being used as inputs when loading said noise transfer function;

means for transforming the loaded model to a noise transfer function having a form that is amenable to matrix-Padé approximation; and means for applying Matrix-Padé via Lanczos manipulation to the transformed matrix-Padé amenable noise transfer function to generate a reduced-order model of the noise transfer function for the electronic system, said reduced-order model representing a hierarchical approximation of the noise power cross-spectral density of the electronic system.

45. The simulator of claim 44, further comprising means for simulating said electronic system based on said reduced-order model of the noise power cross-spectral density.

46. The simulator of claim 44, wherein said approximating means comprises:

means for constructing a model of a noise transfer function for said one electronic circuit;

means for transforming the model constructed to a noise transfer function having a form that is amenable to matrix-Padé approximation; and means for applying Matrix-Padé via Lanczos manipulation to the transformed matrix-Padé amenable noise transfer function to generate a reduced-order model of the noise transfer function for said one electronic circuit, said reduced-order model representing an approximation of the noise power cross-spectral density matrix of said one electronic circuit.

47. The simulator of claim 46, wherein said model constructed is defined by $$F(s) = L^T (G+sC)^{-1} B (P(s))^{-1} B^T (G+sC)^{-H} L$$

where s=jω,

L is a real N×p matrix,

G and C are real N×p matrices,

B is a real N×M matrix, and

P(s) is a predefined matrix polynomial.

48. The simulator of claim 46, wherein the matrix-Padé amenable noise transfer function is defined by $$F(s) = \tilde{L}^T (\tilde{G}+s\tilde{C})^{-1} \tilde{L}$$

where s=jω, $\tilde{L}$ is a real matrix of size $\tilde{N} \times p$, $\tilde{G}$ is an $\tilde{N} \times \tilde{N}$ matrix representing resistive electronic devices and noise source information for the electronic circuit, and $\tilde{C}$ is an $\tilde{N} \times \tilde{N}$ matrix representing reactive electronic devices and noise source information for the electronic circuit.

49. The simulator of claim 48, wherein $\tilde{G}$ is a matrix defined by $$\tilde{G} = \begin{bmatrix} 0 & G^T & 0 & 0 & \cdots & 0 \\ G & 0 & B & 0 & \cdots & 0 \\ 0 & B^T & P_0 & 0 & \ddots & \vdots \\ 0 & 0 & 0 & -I & \ddots & 0 \\ \vdots & \vdots & \ddots & \ddots & \ddots & 0 \\ 0 & 0 & \cdots & 0 & 0 & -I \end{bmatrix}$$

and $\tilde{C}$ is a matrix defined by $$\tilde{C} = \begin{bmatrix} 0 & -C^T & 0 & 0 & \cdots & 0 \\ C & 0 & 0 & 0 & \cdots & 0 \\ 0 & 0 & P_1 & P_2 & \cdots & P_m \\ 0 & 0 & I & 0 & \cdots & 0 \\ \vdots & \vdots & \ddots & \ddots & \ddots & \vdots \\ 0 & 0 & \cdots & 0 & I & 0 \end{bmatrix}.$$

50. The simulator of claim 48, wherein said predefined matrix polynomial is defined by $$P(s)=P_0+P_1 s+P_2 s^2+\ldots+P_m s^m,$$

where m is the degree of said predefined matrix polynomial, the coefficients $P_i$ are M×M matrices where i=0, 1, . . . , m, and $P_m$ is not the zero matrix.

51. The simulator of claim 44, wherein said reduced-order model of the noise transfer function for the electronic system is defined by $$F_n(s_0+\sigma)=\eta^T(I+\sigma T_n)^{-1}\rho$$

where $\rho$ and $\eta$ are n×p matrices that contain the recurrence coefficients for processing right and left starting blocks of the Lanczos-type process, I is the n×n identity matrix, $T_n$ is an n×n banded matrix generated by n steps of the Lanczos-type process, $\sigma$ is a function of frequency.

52. The simulator of claim 46, wherein said reduced-order model of the noise transfer function for said one electronic circuit is defined by $$F_n(s_0+\sigma)=\eta^T(I+\sigma T_n)^{-1}\rho$$

where $\rho$ and $\eta$ are n×p matrices that contain the recurrence coefficients for processing right and left starting blocks of the Lanczos-type process, I is the n×n identity matrix, $T_n$ is an n×n banded matrix generated by n steps of the Lanczos-type process, $\sigma$ is a function of frequency.

53. The simulator of claim 46, wherein said constructing means comprises:

means for determining interconnectivity among the electronic devices in said one electronic circuit;

means for constructing a plurality of matrices representing a plurality of discrete characteristics of said one electronic circuit and based on the interconnectivity among the electronic devices of said one electronic circuit;

means for selecting outputs of said one electronic circuit at which the noise power cross-spectral density matrix will be approximated;

means for identifying quantity and location of noise sources in said one electronic circuit; and means for determining the power spectral density for each identified noise source.

54. The simulator of claim 53 wherein said means for constructing a plurality of matrices comprises:

means for constructing a first matrix representing resistive electronic devices in said one electronic circuit; and means for constructing a second matrix representing reactive electronic devices in said one electronic circuit.

* * * * *